(12) United States Patent
Barrette

(10) Patent No.: US 9,824,906 B2
(45) Date of Patent: Nov. 21, 2017

(54) METHODS AND STRUCTURES FOR HANDLING INTEGRATED CIRCUITS

(71) Applicant: Altera Corporation, San Jose, CA (US)

(72) Inventor: Terry Lynne Barrette, San Jose, CA (US)

(73) Assignee: Altera Corporation, San Jose, CA (US)

( * ) Notice: Subject to any disclaimer, the term of this patent is extended or adjusted under 35 U.S.C. 154(b) by 282 days.

(21) Appl. No.: 14/470,742

(22) Filed: Aug. 27, 2014

(65) Prior Publication Data
US 2015/0063977 A1   Mar. 5, 2015

Related U.S. Application Data

(60) Provisional application No. 61/873,168, filed on Sep. 3, 2013.

(51) Int. Cl.
*H01L 21/673* (2006.01)
*H05K 13/04* (2006.01)

(52) U.S. Cl.
CPC .. *H01L 21/67336* (2013.01); *H01L 2224/131* (2013.01); *H05K 13/0404* (2013.01)

(58) Field of Classification Search
CPC ........ H01L 21/67336; H01L 21/67333; H05K 13/04; H05K 13/021; H05K 13/0404; H05K 13/0413
See application file for complete search history.

(56) References Cited

U.S. PATENT DOCUMENTS

| | | | |
|---|---|---|---|
| 5,104,581 A * | 4/1992 | Ito | H01B 1/24 252/506 |
| 5,547,082 A | 8/1996 | Royer et al. | |
| 5,731,230 A | 3/1998 | Nevill et al. | |
| 6,112,795 A * | 9/2000 | Emmett | H01L 21/67356 156/556 |
| 6,319,354 B1 * | 11/2001 | Farnworth | B28D 5/0094 156/707 |
| 6,349,832 B1 * | 2/2002 | Han | B65D 1/36 206/459.5 |
| 6,474,475 B1 | 11/2002 | Bjork | |
| 6,568,535 B1 | 5/2003 | Pylant | |

(Continued)

FOREIGN PATENT DOCUMENTS

CN        1388566 A        1/2003
CN       201084180         7/2008

(Continued)

*Primary Examiner* — Glenn Myers
(74) *Attorney, Agent, or Firm* — Tianyi He

(57) ABSTRACT

In one embodiment, a tray that includes a dielectric frame structure, a re-adherable pad and a marking is disclosed. The dielectric frame structure includes a recessed region where the re-adherable pad is formed. A plurality of integrated circuits is placed on a re-adherable surface of the re-adherable pad. The marking on the dielectric frame that is reflective of a given input-output pin position for each integrated circuit in the plurality of integrated circuits in the tray. In addition to that, two methods are also disclosed. First, a method of handling the integrated circuits using the tray is disclosed. Second, a method of forming the tray is also disclosed.

17 Claims, 6 Drawing Sheets

(56) References Cited

U.S. PATENT DOCUMENTS

| | | | |
|---|---|---|---|
| 6,938,783 B2* | 9/2005 | Chung | B32B 7/12 |
| | | | 206/713 |
| 7,029,931 B2 | 4/2006 | Cobbley et al. | |
| 7,108,899 B2* | 9/2006 | Extrand | H05K 13/0084 |
| | | | 206/710 |
| 7,755,204 B2 | 7/2010 | Cobbley et al. | |
| 2002/0121681 A1 | 9/2002 | Wyant et al. | |
| 2009/0123257 A1* | 5/2009 | Zin | H01L 21/67333 |
| | | | 414/222.02 |
| 2011/0293168 A1* | 12/2011 | Matsushima | H05K 13/08 |
| | | | 382/151 |

FOREIGN PATENT DOCUMENTS

| | | |
|---|---|---|
| CN | 101769974 A | 7/2010 |
| JP | 2001298080 A | 10/2001 |

\* cited by examiner

METHODS AND STRUCTURES FOR HANDLING INTEGRATED CIRCUITS

This application claims the benefit of provisional patent application No. 61/873,168, filed Sep. 3, 2013, which is hereby incorporated by reference herein in its entirety.

BACKGROUND

An integrated circuit may be manufactured at one location (i.e., a wafer fabrication plant) but packaged at another location (i.e., a test and assembly plant). Oftentimes, different water fabrication plants manufacture integrated circuits using different process technologies. In such instances, a partially-formed integrated circuit or a partially-formed integrated circuit package is sent to one semiconductor manufacturing plant so that the partially-formed devices may be further processed.

However, integrated circuit dies transferred from one plant to another are more prone to being damaged due to increased shipping and handling procedures involved in packing and unpacking the integrated circuits. For example, integrated circuits are often mishandled when a test operator manually extracts an integrated circuit from a shipping box. In other instances, integrated circuits are damaged due to electrostatic discharge (ESD) events while being transported in a shipping container.

Many precautionary steps such as proper training and automated tools have been developed to prevent damage to the integrated circuits when being transferred between manufacturing facilities. Current state of the art procedures, however, still result in more than 30% of the integrated circuits being damaged due to improper handling.

It is within this context that the embodiments described herein arise.

SUMMARY

Embodiments described herein include an integrated circuit handling tray having a re-adherable surface. Integrated circuit dies placed at a predetermined position on the re-adherable surface are held in that position as result of the adhesive properties of the surface; however, the dies placed on the re-adherable material can be removed using a pre-determined amount of force that does not damage the die. A tray of this type may serve to receive one or more integrated circuit dies arranged in a predetermined configuration, where the integrated circuit dies are placed directly on the re-adherable material. In one embodiment, the integrated circuit dies may be placed within the tray using a predetermined template (e.g., a grid-like structure) that specifies the position of the dies on the re-adherable surface. In another embodiment, the integrated circuit dies may be placed within the tray using an automated pick-and-place tool. Optionally, certain embodiments can include an ESD protection film that is placed over the integrated circuit dies after they have been placed on the re-adherable surface to prevent damage from potential ESD events during shipping and handling. It should be appreciated that the embodiments described herein can be as advantageously used as part of a process, an apparatus, a system, a device, or a method.

Further features of the invention, its nature and various advantages will be more apparent from the accompanying drawings and the following detailed description of the preferred embodiments.

DETAILED DESCRIPTION

The following embodiments describe an integrated circuit handling tray that can be used to store and transport integrated circuit dies during manufacturing and shipment. It is noted that one skilled in the art can modify the embodiments described herein and may be practiced without some or all of these specific details. In other instances, well-known operations have not been described in detail in order not to unnecessarily obscure the present embodiments.

Figure 1:
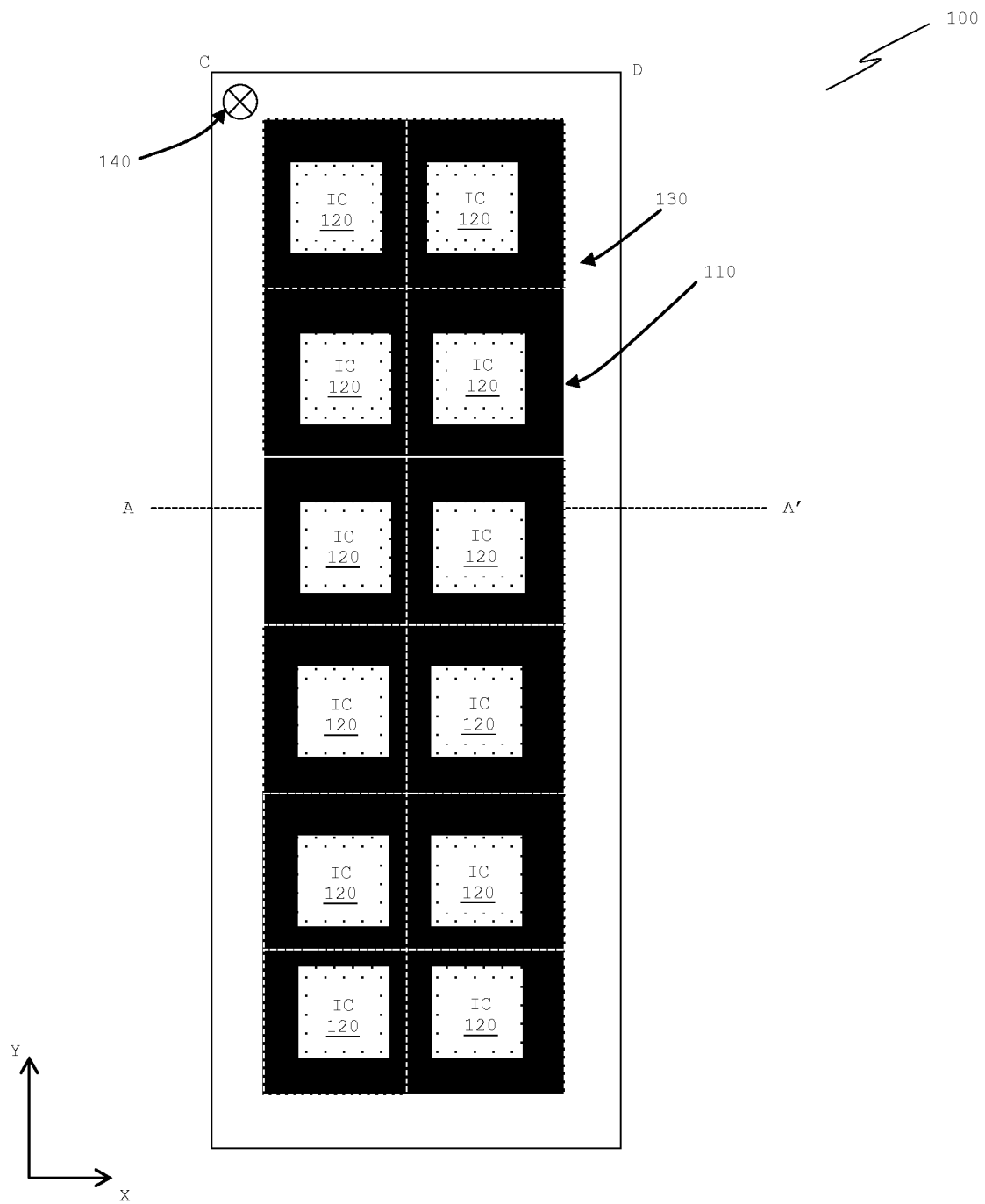
FIG. 1 shows an illustrative tray for handling integrated circuit dies in accordance with one embodiment of the present invention.

FIG. 1, meant to be illustrative and not limiting, illustrates an integrated circuit handling tray 100 having a re-adherable surface, in accordance with one embodiment. The tray 100 includes a housing frame 130, a marker 140, and a sheet having a re-adherable surface 110 on which integrated circuit (IC) 120 may be placed. In certain embodiments, the dimensions of the tray may selected to conform with those specified by certain standards used in the semiconductor industry (e.g., the Joint Electron Device Engineering Council (JEDEC) standard), such that the tray can be used in conjunction with other equipment that conforms to these standards. Similarly, the integrated circuit dies can positioned on the re-adherable surface 110 in predetermined positions that are specified by industry standards. For example such standards can specify the horizontal and/or vertical spacing between the integrated circuit dies, the location of pin 1 of the dies with reference to the marker, etc.

Tray 100 may be utilized for transporting integrated circuits 120 from one location to another. Tray 100 may be used as part of a manufacturing process, where it can be directly inserted into device handling equipment or used in conjunction with device handling equipment that selectively removes integrated circuit dies from the re-adherable surface using a predetermined force that does not damage the die. In one embodiment, the integrated circuit dies are placed at predetermined positions on the re-adherable surface 110, and equipment such as an automated pick and place machine may be used to place and/or remove integrated circuits 120 from re-adherable surface 110. Advantageously, if the location of the devices conforms to a predetermined standard (e.g., the JEDEC standard), equipment conforming to the standard can be used to place and remove the integrated circuit dies. Configured in this way, customers may directly use their available device handling equipment that conforms with the JEDEC standard instead of having to manually remove the devices from tray 100 or having to alter or buy new machinery to support the handling of tray 100.

Tray 100 may also eliminate the element of manual (human) intervention, which involves manually picking the integrated circuits 120 to prepare for subsequent processing operations (e.g., packaging process). It should be appreciated that the manual retrieving of integrated circuits 120 generally results in inadvertently damaging the integrated circuit 120.

In one embodiment, the X-directional length and Y-directional length for tray 100 may be 140 millimeter and 320 mm, respectively (see, FIG. 1). The X and Y lengths may be based on the JEDEC standard. It should be appreciated that the X and Y dimensions of tray 100 conform to the JEDEC standards so that corresponding device handling equipment is capable of receiving a JEDEC standard sized tray 100.

Tray 100 may include a recessed area or an opening where the re-adherable surface 110 may be located. In the example of FIG. 1, the re-adherable surface 110 may be located in the middle portion of tray 100. As an example, re-adherable surface 110 may have an X-directional length of 135 millimeter and Y-directional length of 315 mm. In one suitable arrangement, re-adherable surface 110 is formed using a "tacky" mat. The tacky mat may exhibit a desired adhesive level. Generally, re-adherable surface 110 may have an adhesive level that ranges from level 1 (i.e., a mat that has relatively low adhesion capabilities) to level 7 (i.e., a mat that has relatively high adhesion capabilities). As an example, re-adherable surface 110 may have an adhesion level of 6.

In one embodiment, the adhesive level of the mat can be selected to be within a predetermined range, where the adhesive level exceeds a minimum value that is sufficient to hold the integrated circuit die in position during transportation, and where the adhesive level is less than a maximum value such that integrated circuit dies placed on the mat can be removed from the mat without damaging the dies. As will be understood, the minimum and maximum adhesive range of the mat, as well as the selected adhesive level for the re-adherable surface of the mat, can depend on the characteristics of the integrated circuit die that is to be place on (and subsequently removed) from the re-adherable surface of the mat.

In general, the selection of re-adherable material for re-adherable surface 110 may take into account factors such as: (i) the maximum force at which an automated pickup tool is able to pick up integrated circuit 120 from re-adherable surface 110 and (ii) the minimum adhesion level that is necessary to keep a component at a fixed location on re-adherable surface 110 during transport of tray 100. Re-adherable surface 110 may therefore sometimes be referred to as a non-slip mat, a slip-resistant mat, an anti-skid mat, or a sticky mat that is formed from elastomeric materials (e.g., silicone), gel-like materials, materials with relatively high viscosity, and/or other materials with sufficient adhesion characteristics. For example, re-adherable surface 110 may be formed from materials with a modulus of elasticity (also known as Young's modulus) of 0.001 to 0.05, 0.0001 to 0.5, 0.005 to 0.01, or other suitable ranges. Typically, the adhesion level of the re-adherable surface is sufficient to hold the integrated circuit dies in position without requiring the use of any other structures and methods, such as vacuum, applied pressure, or other adhesive materials.

Referring still to FIG. 1, integrated circuits 120 are placed on a top surface of re-adherable surface 110. The placement of integrated circuits 120 may depend on the size of integrated circuits 120. In one exemplary embodiment, when the dimensions of integrated circuit 120 are 40 mm×40 mm, integrated circuit 120 nearest to corner C may be placed 29.22 mm away from corner C in X-direction and 31.10 mm distance away from corner C in Y-direction. Another integrated circuit 120 that is adjacent to the abovementioned integrated circuit 120 may be placed 77.46 mm in X-direction (that is the one located on the same row) or 50.56 mm in Y-direction (that is the one located on the same column) away from the midpoint of the abovementioned integrated circuit 120.

In the example of FIG. 1, tray 100 may fit at least 12 integrated circuits 120, i.e., two integrated circuits 120 on each row and six integrated circuits 120 in each column. A pick and place process to places and/or removes individual dies from tray 100 may be automated as the locations of integrated circuits 120 on tray 100 follow a predefined template. The template may be different depending on the factors such as: (i) size of integrated circuits 120, (ii) size of the pickup tool, and (iii) ESD concerns. For example, a tray of a first type may serve to house IC dies of a first size, whereas tray of a second type may serve to house IC dies of a second size that is different than the first size. Different templates may be used to align the different sized dies on different trays 100. When dies 120 are manually placed within tray 100, a removable template such as a grid-like structure with openings corresponding to locations at which dies should be placed on re-adherable surface 110 in accordance with the JEDEC standard can be used to position the dies on tray 100 (e.g., the template may be placed on re-adherable surface 110 when placing the dies within tray 100 and may be removed prior to laminating the ESD film).

In certain embodiments, the methods and structures described herein can also be used in conjunction with a flip-chip integrated circuit or a wire-bonded integrated circuit, where such circuits are placed on the re-adherable surface 110 instead of the integrated circuit. For a flip-chip integrated circuit, the solder balls on the integrated circuit may be directly placed on the surface of re-adherable surface 110 (see, e.g., FIG. 2). Alternatively, a wire-bonded integrated circuit may be formed in a substrate that makes direct contact with the adhesive pad (while the circuitry formed on top of the substrate faces upwards away from the surface of re-adherable surface 110).

Referring back to FIG. 1, tray 100 may also include an indicator such as marker 140. Marker 140 may be formed as a dot, an indentation, a dimple, or other detectable marking on the border of tray 100. Marker 140 may be utilized in a pick and place system so that a high-resolution camera is capable of detecting the presence of marker 140. In the example of FIG. 1, marker 140 may be located at the top left corner (i.e., near corner C) of tray 100. Marker 140 configured as such may indicate to automated equipment that a first pin location (a pin 1 location) of each die 120 on tray 100 is located at the corner of each die pointing towards corner C (e.g., that the pin 1 location is at the top left corner of each die). Alternatively, marker 140 may be located at the top right corner (i.e., near corner D) of tray 100. It should be appreciated that marker 140 should be close to with integrated circuit 120 so that room for error to pick up integrated circuit 120 is reduced.

Figure 2:
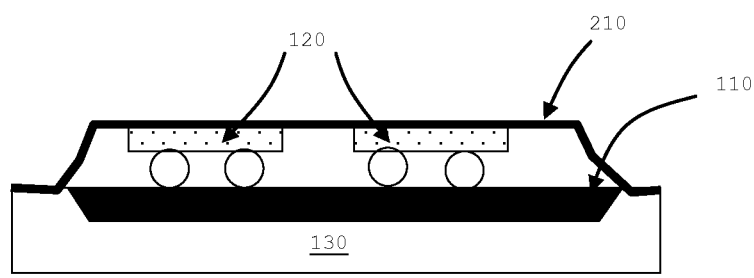
FIG. 2 shows a cross-sectional side view of a tray of the type shown in FIG. 1 in accordance with one embodiment of the present invention.

FIG. 2, meant to be illustrative and not limiting, illustrates a cross-sectional side view taken along dotted line A-A' in FIG. 1 that includes two flip-chip integrated circuits 120 placed on tray 100 in accordance with one embodiment of the present invention. Tray 100 may be similar to tray 100 of FIG. 1 and therefore, the details for integrated circuit 120, frame 130, and re-adherable surface 110 will not be repeated again, for the sake of brevity.

As shown in FIG. 2, an electrostatic discharge (ESD) film or tape 210 may placed on top of integrated circuits 120 and tray 100. ESD tape 210 may prevent ESD events from damaging integrated circuits 120 when tray 100 is being transferring from one location to another. ESD tape 210 may be laminated after integrated circuits 120 have been placed on re-adherable surface 110.

Figure 3:
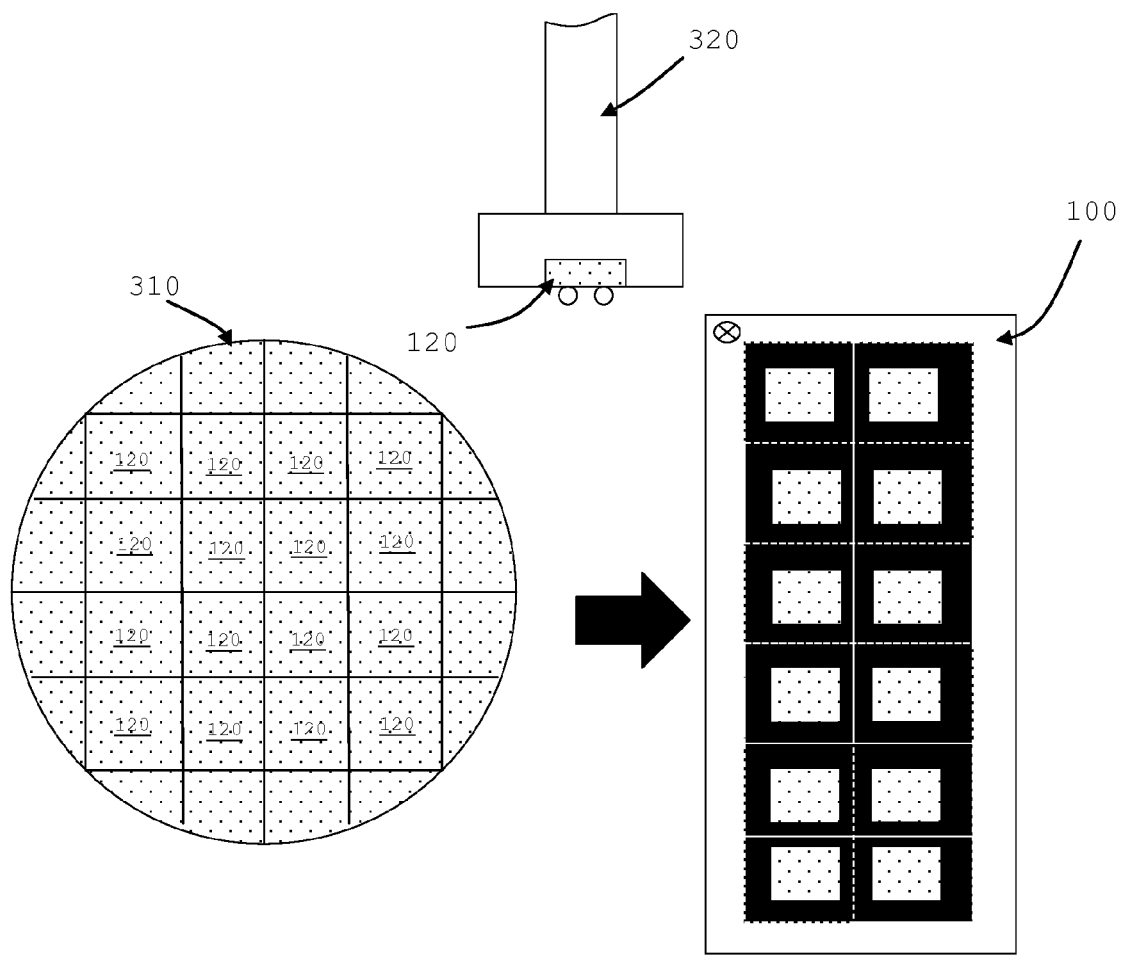
FIG. 3 shows an illustrative process in which one or more integrated circuit dies are picked up and then placed on the tray of FIG. 1 in accordance with one embodiment of the present invention.

FIG. 3, meant to be illustrative and not limiting, illustrates a process in which integrated circuits 120 are picked up from a semiconductor wafer and placed on a tray in accordance with one embodiment of present invention. Semiconductor wafer 310 may include a plurality of integrated circuits 120. Tray 100 may be similar to tray 100 of FIG. 1. The details of integrated circuits 120 and tray 100 will not be repeated again in here for the sake of brevity.

In the example of FIG. 3, there are 16 integrated circuit dies 120 on semiconductor wafer 310. Wafer 310 may be cut using automated sawing tools into individual dies 120. Each integrated circuit die 120 may then be picked up and placed on the re-adherable surface 110 of the tray 100 using an automated pick and place tool 320. Typically, such a pick and place tool is commonly available in a device handler. It should be appreciated that there may be a plurality of other process before the pick and place process is performed on semiconductor wafer 310. In accordance with the embodiments described above, a template can be optionally used to place the integrated circuit dies at predetermined positions on the re-adherable surface, and an ESD protective sheet can be placed over the dies after they have been positioned on the re-adherable surface to protect the dies from ESD damage.

Figure 4:
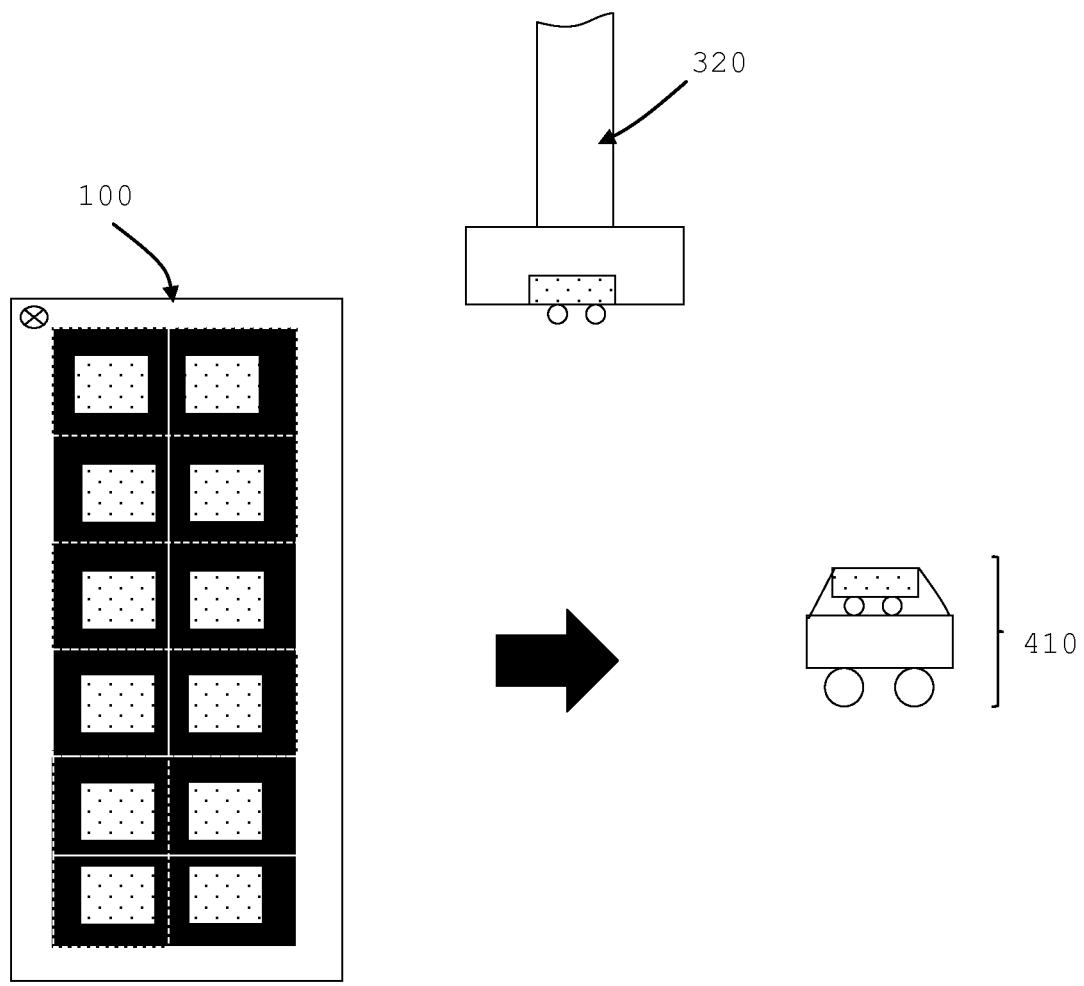
FIG. 4 shows an illustrative process in which one or more integrated circuit dies are picked up from the tray of FIG. 1 and then subsequently packaged in accordance with one embodiment of the present invention.

FIG. 4, meant to be illustrative and not limiting, illustrates a process in which integrated circuits 120 can be picked from a tray and is utilized for subsequent process in accordance with one embodiment of present invention. In one embodiment, the subsequent process includes mounting integrated circuit 120 on a package substrate, laminating the entire package substrate and integrated circuit 120 to form integrated circuit package 410 (e.g., a single-chip integrated circuit package or a multi-chip integrated circuit package). Tray 100 may be similar to tray 100 of FIGS. 1-3. Pickup tool 320 may also be similar to pickup tool 320 of FIG. 3. Therefore, the details of integrated circuit 120 and tray 100 will not be repeated again in here.

In FIG. 4, integrated circuit 120 may be picked from tray 100. Subsequently, integrated circuit 120 may be processed accordingly to manufacture integrated circuit package 410. The pick and place eliminates the manual human intervention (i.e., touching of integrated circuit 120) completely.

Figure 5:
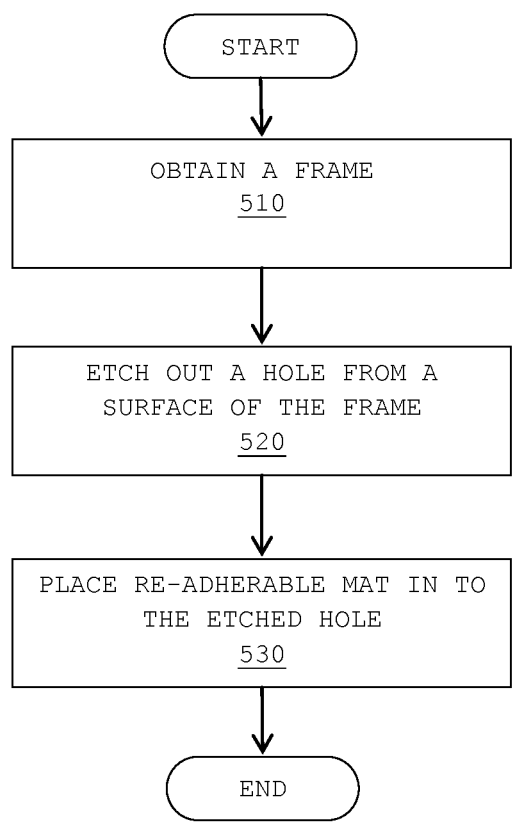
FIG. 5 is a flow chart of illustrative steps for manufacturing the tray of FIG. 1 in accordance with one embodiment of the present invention.

FIG. 5, meant to be illustrative and not limiting, illustrates a flowchart of illustrative steps for manufacturing a handling tray for integrated circuits in accordance with one embodiment of the present invention. The handling tray and the integrated circuits may be similar to tray 100 and integrated circuits 120 of FIG. 1.

At step 510, a frame (e.g., a plastic molded tray) is obtained. The frame may be similar to frame 130 of FIG. 1. The frame may have the dimensions of 135.9 mm×322.6 mm, in one embodiment. If desired, the frame may be formed from ceramic, glass, polymer, or other dielectric material.

At step 520, a portion of the frame surface may be etched away to form a recess. The recess should be a sufficiently large region so that a desired number of components can be placed within tray according to a predetermined standard. In one embodiment, the portion of frame that is etched away may have a dimension of 135 mm×315 mm. It should be appreciated that the etching process may be similar to the commonly used etching process within semiconductor industry. In certain embodiments, steps 510 and 520 can be optionally replaced with a molding step that is used to form a tray having a recessed opening.

At step 530, a re-adherable mat is placed into the etched recess. In this instance, the tray may look similar to tray 100 of FIG. 1. The re-adherable mat may be similar to the re-adherable mat that is disposed on re-adherable surface 110.

Figure 6:
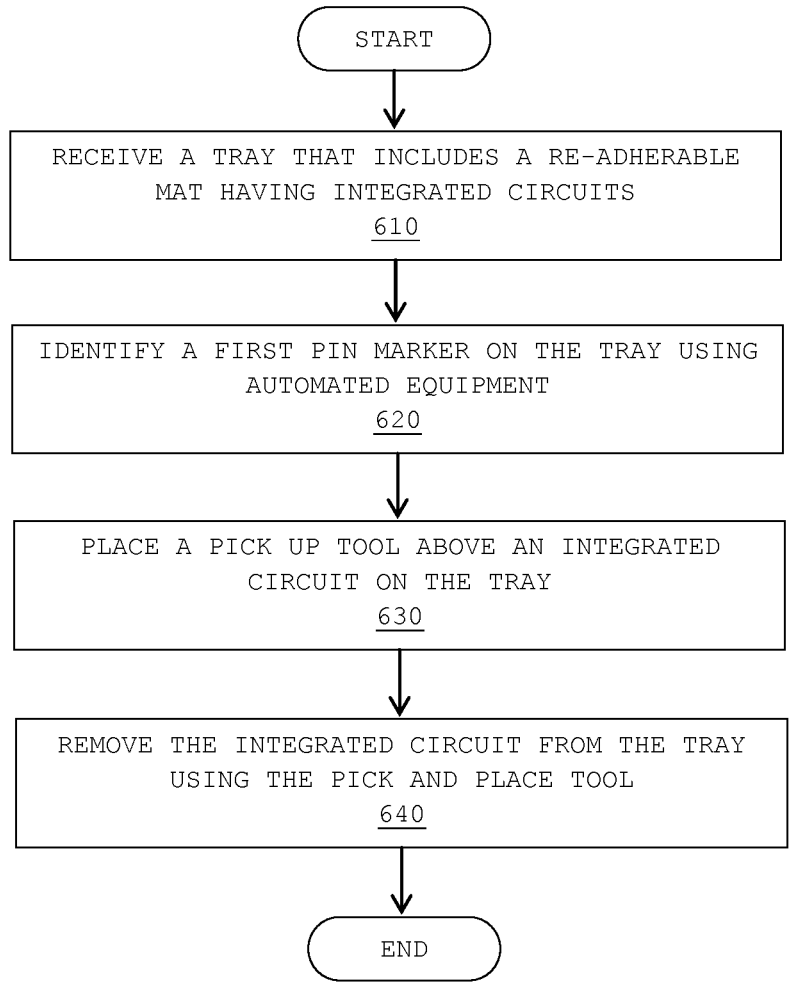
FIG. 6 is a flow chart of illustrative steps for handling the tray of FIG. 1 for integrated circuits in accordance with one embodiment of the present invention.

FIG. 6, meant to be illustrative and not limiting, illustrates a flowchart of illustrative steps for a handling tray for integrated circuits in accordance with one embodiment of the present invention. Similar to FIG. 5, the handling tray and the integrated circuits may be similar to tray 100 and integrated circuits 120 of FIG. 1.

At step 610, a tray that has a re-adherable mat is received. The tray may be similar to tray 100 of FIG. 1. It should be appreciated that the tray conforms to the JEDEC standard so that further handling using the JEDEC standard equipment may be performed. The re-adherable mat may be similar to the re-adherable surface 110 of FIG. 1. A plurality of integrated circuits placed on the re-adherable mat. In one embodiment, the integrated circuits may be placed on the re-adherable mat in a similar manner as integrated circuit 120 shown FIG. 1.

At step 620, a first pin marker is identified. Generally, the first pin marker is located on a top left corner of the tray. In one embodiment, the first pin marker may be similar to marker 140 of FIG. 1. The first pin marker may be identified using an automated equipment, for example, a pick and place equipment. The pick and place equipment may include a pick up tool, which may be similar to pick up tool 320 of FIG. 3. In one embodiment, the automated equipment includes a high resolution camera that is capable of scanning the tray for the first pin marker. It should be appreciated that identification of the first pin marker may include steps such as: (i) comparing the image with a predefined marker stored within the memory of the automated equipment, and (ii) determining if there is a structure similar to the predefined marker.

At step 630, the pickup tool of the automated equipment right above a first integrated circuit on the tray. The first integrated circuit on the tray may be the one located closest to the marker (e.g., the top left integrated circuit 120 of FIG. 1). The information of the first integrated circuit may be received after determining the location of the first pin marker from step 620.

At step 640, the integrated circuit is removed from the tray using the pickup tool. The integrated circuit may be removed from the tray in such manner as not to displace other integrated circuits from its original locations on the tray. The factors that may enable integrated circuits to be removed without displacing other integrated circuits include: (i) the placement of the integrated circuits on the tray that conforms the JEDEC, and (ii) the re-adherable material.

The embodiments described herein in which bare dies are placed on the re-adherable surface on tray 100 are merely illustrative. In other embodiments, bare integrated circuit dies, single-chip integrated circuit packages, multichip integrated circuit packages, discrete surface-mount components, and/or other suitable electronic components may be placed on the re-adherable surface 110 within tray 100.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for handling integrated circuits, comprising:
   receiving a tray having a re-adherable surface on which the integrated circuits are placed;
   with automated equipment, removing some of the integrated circuits from the re-adherable surface of the tray; and
   with the automated equipment, identifying a pin marker that is available on the tray, wherein the pin marker indicates locations of more than one integrated circuit in the placed integrated circuits.

2. The method as defined in claim 1, wherein remaining integrated circuits are still in contact with the re-adherable material.

3. The method as defined in claim 1, wherein the tray conforms to specifications of a Joint Electron Device Equipment Council (JEDEC) standard.

4. The method as defined in claim 1, further comprising:
   with the automated equipment, positioning a pick and place tool above a first of the integrated circuits based on the information of the pin marker.

5. The method as defined in claim 4, further comprising:
   with the automated equipment, wherein the first integrated circuit is removed using the pick and place tool.

6. The method as defined in claim 1, wherein the integrated circuits are placed within a recess of the tray, and wherein the integrated circuits are arranged in a plurality of rows within the recess.

7. A method for forming an apparatus that includes a tray, comprising:
   forming a frame structure on the tray, wherein the frame structure includes a top surface and a recessed opening at the top surface;
   placing re-adherable material within the recessed opening, wherein a top surface of the re-adherable material is coplanar with the top surface of the frame structure; and
   placing a plurality of integrated circuits on the re-adherable material according to a predetermined arrangement.

8. The method as defined in claim 7, wherein dimensions of the tray is according to a Joint Electron Device Engineering Council (JEDEC) standard.

9. The method as defined in claim 7, further comprising:
   selecting the re-adherable material from adhesive materials ranging from an adhesive level of one to seven, wherein the adhesive levels of one to seven indicate levels of increasing adhesive strength, wherein the adhesive level of one indicates relatively low adhesive strength, and wherein the adhesive level of seven indicates relatively high adhesive strength.

10. The method as defined in claim 7, wherein the predetermined arrangement includes an arrangement that conforms to the JEDEC standard.

11. The method as defined in claim 7, further comprising:
    forming a first pin marker on a corner edge of the tray.

12. An apparatus, comprising:
    a tray;
    a frame structure formed on the tray, wherein the frame structure includes a top surface and a recessed opening at the top surface;
    re-adherable material placed in the recessed opening, wherein a top surface of the re-adherable material is coplanar with the top surface of the frame structure; and
    a plurality of integrated circuits placed on the re-adherable material according to a predetermined arrangement; and
    a marking on the frame structure that is reflective of a given input-output pin position for each integrated circuit in the plurality of integrated circuits in the tray.

13. The apparatus as defined in claim 12, wherein the frame structure has dimensions specified within a Joint Electron Device Engineering Council (JEDEC) standard.

14. The apparatus as defined in claim 12, wherein the re-adherable material has an adhesive level that ranges from level one to level seven, wherein the adhesive levels of one to seven indicate levels of increasing adhesive strength, wherein the adhesive level of one indicates relatively low adhesive strength, and wherein the adhesive level of seven indicates relatively high adhesive strength.

15. The apparatus as defined in claim 12, further comprising:
an electrostatic discharge (ESD) tape placed on the plurality of integrated circuits, wherein the ESD tape reduces damage of the plurality of integrated circuits from ESD events.

16. The apparatus as defined in claim 12, wherein the frame structure comprises an injection molded structure.

17. The apparatus as defined in claim 12, wherein the recessed opening comprises an etched region within the tray.

* * * * *